United States Patent
Mullin et al.

(10) Patent No.: US 7,586,079 B2
(45) Date of Patent: Sep. 8, 2009

(54) LOW POWER GLARE SENSOR

(75) Inventors: Christopher Mullin, Amherst, NY (US);
Albert H. Titus, Buffalo, NY (US);
Kiriti Bhagavathula, Folsom, CA (US)

(73) Assignee: Dynamic Eye, Inc., Pittsburgh, PA (US)

( * ) Notice: Subject to any disclaimer, the term of this patent is extended or adjusted under 35 U.S.C. 154(b) by 32 days.

(21) Appl. No.: 11/434,599

(22) Filed: May 13, 2006

(65) Prior Publication Data
US 2007/0012869 A1      Jan. 18, 2007

Related U.S. Application Data (60) Provisional application No. 60/680,581, filed on May 13, 2005.

(51) Int. Cl.
G01J 1/44 (2006.01)
G01J 1/36 (2006.01)
G02B 27/00 (2006.01)

(52) U.S. Cl. .................... 250/214 R; 250/204; 359/601

(58) Field of Classification Search ............. 250/214 R,
250/201.1, 204, 206, 214.1, 214 D, 205;
333/181; 359/265, 267, 843, 601–610; 385/12,
385/14, 101; 356/300–303; 345/77, 84,
345/90; 219/121.61, 121.62
See application file for complete search history.

(56) References Cited

U.S. PATENT DOCUMENTS

| | | | | |
|---|---|---|---|---|
| 4,701,022 A | * | 10/1987 | Jacob | ................ 359/603 |
| 4,848,890 A | | 7/1989 | Horn | |
| 4,968,127 A | | 11/1990 | Russell et al. | |
| 5,204,778 A | * | 4/1993 | Bechtel | .............. 359/604 |
| 5,377,037 A | | 12/1994 | Branz et al. | |
| 5,760,962 A | * | 6/1998 | Schofield et al. | ........ 359/604 |
| 5,841,507 A | | 11/1998 | Barnes | |
| 5,923,028 A | | 7/1999 | Turnbull et al. | |
| 5,930,047 A | | 7/1999 | Gunz et al. | |
| 6,061,091 A | | 5/2000 | Van de Poel et al. | |
| 6,244,703 B1 | | 6/2001 | Resnikoff et al. | |
| 6,337,624 B1 | * | 1/2002 | Nakaho et al. | ............ 340/475 |
| 6,379,013 B1 | * | 4/2002 | Bechtel et al. | ............ 359/604 |
| 6,405,105 B1 | | 6/2002 | Hsu et al. | |
| 6,467,914 B1 | | 10/2002 | Cohen et al. | |
| 6,483,090 B1 | | 11/2002 | Bae | |

(Continued)

*Primary Examiner*—Georgia Y Epps
*Assistant Examiner*—Don Williams (57) ABSTRACT

The invention may be embodied as a glare detection system or as a method of detecting glare. In a system according to the invention, there may be a light receiving surface, a first input channel, a second input channel, a glare signaling circuit and a glare reducing circuit. The first input channel may provide an indication of the amount of light impinging on a first portion of the light receiving surface. The second input channel may provide an indication of the amount of light impinging on a second portion of the light receiving surface. The glare signaling circuit ("GSC") may have a first input port in communication with the first input channel, a second input port in communication with the second input channel, a logic-or gate capable of producing an output signal when the logic-or gate detects that the first input channel or the second input channel indicates glare on the light receiving surface. The glare reducing circuit ("GRC") may be in communication with the logic-or gate, and may be capable of reacting when the logic-or gate produces the output signal. For example, the GRC may react by determining where on the light receiving surface glare exists.

31 Claims, 10 Drawing Sheets

U.S. PATENT DOCUMENTS

| | | |
|---|---|---|
| 6,504,142 B2 | 1/2003 | Nixon et al. |
| 6,568,738 B1 | 5/2003 | Braun |
| 6,614,409 B1 | 9/2003 | Bae |
| 6,710,823 B2 | 3/2004 | Faris et al. |
| 6,734,904 B1 | 5/2004 | Boon et al. |
| 6,737,629 B2 | 5/2004 | Nixon et al. |
| 6,786,610 B2 | 9/2004 | Faris |
| 6,796,652 B1 | 9/2004 | Sonderegger |
| 6,819,367 B1 | 11/2004 | Cava |
| 6,891,681 B2 | 5/2005 | Schindele |
| 6,936,807 B1 * | 8/2005 | Su et al. ............... 250/214 R |
| 7,087,878 B2 * | 8/2006 | Nixon et al. ............... 250/206 |
| 7,205,524 B2 * | 4/2007 | Drummond et al. ...... 250/214 C |
| 2001/0050340 A1 * | 12/2001 | Holz et al. ............... 250/341.1 |

* cited by examiner

LOW POWER GLARE SENSOR

CROSS-REFERENCE TO RELATED APPLICATION

This application claims the benefit of priority to U.S. provisional patent application Ser. No. 60/680,581, filed on May 13, 2005.

FIELD OF THE INVENTION

The present invention relates to circuitry for detecting and reacting to glare on a light receiving surface.

BACKGROUND OF THE INVENTION

Light sources vary across a large range of brightness. The human eye can adapt to a wide range of average brightness by adjusting the size of the iris and by varying the chemical response in the retina, but human eyes have difficulty adjusting to a wide range of brightness within a single scene. Bright sources of light within a scene are often perceived as glare. Glare-shielding sunglasses have been developed to reduce glare. In general, glare-shielding sunglasses use an image sensor to detect a glare source, and then certain of the addressable light valves in the lenses of the sunglasses are caused to decrease the amount of light being transmitted according to the location of the glare source. To fit the necessary electronics and their associated power supply into a product as lightweight as a pair of sunglasses, the electronics must be designed to consume as little power as possible.

Figure 1:
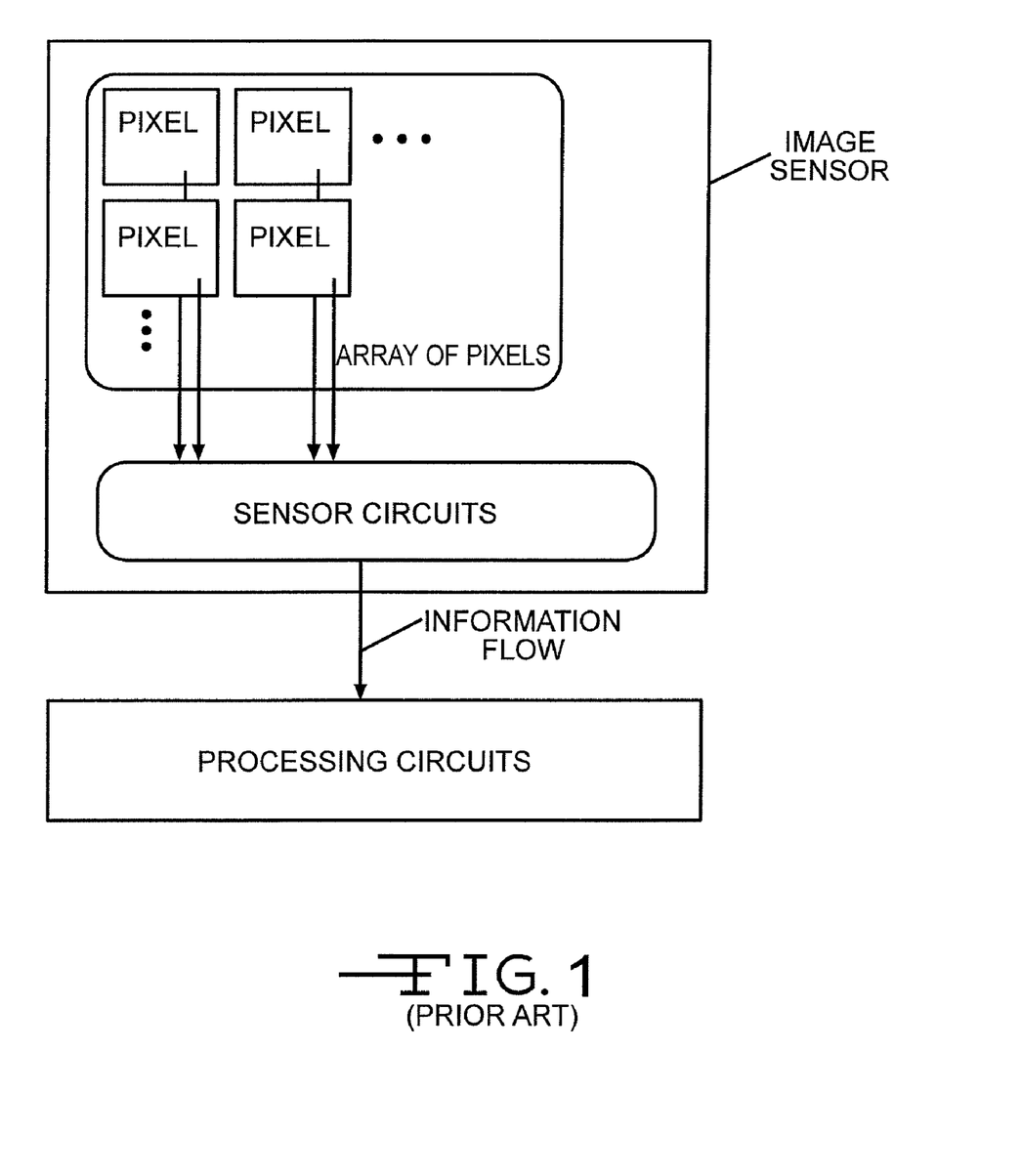
FIG. 1, which is a schematic representation of a prior art image sensor with glare reduction capabilities.

Existing image sensors detect light falling on each pixel of a light receiving surface. FIG. 1 is a schematic of such a sensor. Such image sensors usually have circuitry ("sensor circuits") located adjacent to the light receiving surface, which accept charges from each pixel and convert those charges into signals that can be transmitted. Signals from each pixel may be in the form of an analog voltage, charge, or current, and the sensor circuits may amplify, digitize, and/or convert the signals to one of the other forms. Next, the signals from the sensor circuits are sent to processing circuits, which usually are not packaged with the light receiving surface, but instead are located remotely from the light receiving surface. The processing circuits determine whether glare is present on the light receiving surface, and if glare is present, how to reduce the glare.

For example, charge-coupled devices (CCDs) typically move an electric charge stored at each pixel to sensor circuits at the edge of the light receiving surface, where the charge is converted to an analog voltage, which is then transmitted to the processing circuits. Complementary metal-oxide-semiconductor (CMOS) image sensors transmit an analog voltage or current to the sensor circuits, which can strengthen the signal through amplification, process the signal to suppress noise, and convert the format of the signal so that it conforms to specific electronic standards, such as the NTSC standard for television signals. Some existing sensor circuits include analog-to-digital (A/D) converters, so that only digital signals are sent to the processing circuits. However, the signal sent from the pixel to the sensor circuits is analog because to form a picture, numerous shades are necessary. Analog signals consume a large amount of power, and it would be helpful to reduce the power consumption needed to detect glare.

SUMMARY OF THE INVENTION

Generally speaking, a glare detection system according to the invention may include a first light sensor having an output channel and a second light sensor having an output channel. A glare signaling circuit ("GSC") may have a first input in communication with the output channel of the first light sensor, and a second input in communication with the output channel of the second light sensor. The GSC may have a logic-or gate capable of providing an indication of glare when glare is detected on the first light sensor or the second light sensor.

In a system that includes such a glare detection system, there may be a light receiving surface, a first input channel, a second input channel, a glare signaling circuit and a glare reducing circuit. The first input channel may provide an indication of the amount of light impinging on a first portion of the light receiving surface. The second input channel may provide an indication of the amount of light impinging on a second portion of the light receiving surface.

The GSC may have a first input port in communication with the first input channel, a second input port in communication with the second input channel, and a logic gate capable of producing an output signal when the logic gate detects that the first input channel or the second input channel indicates glare on the light receiving surface. For ease of reference, the term "logic-or gate" will be used to refer to logic gates combine information from a plurality of inputs, for example the logical OR function. The glare reducing circuit ("GRC") may be in communication with the GSC, and the GRC may be capable of reacting when the GSC produces the output signal. For example, the GRC may react by determining where on the light receiving surface glare exists.

A system according to the invention may include a glare determination circuit ("GDC") having, an input in communication with the first input channel, a threshold input, and an output in communication with the GSC first input port, wherein the GDC provides a glare signal via the GDC output when the first input channel indication is not in an acceptable range relative to the threshold input. The GDC may provide the glare signal when the first input channel indication is greater than the value of a signal on the threshold input. The GDC may accept an analog signal at the GDC input and the glare signal may be provided as a digital signal. The system may include circuitry for transmitting the glare signal to a switch, which controls the provision of information from the first input channel to the GRC when the glare signal is received by the switch, and in this manner the GRC may determine where on the light receiving surface glare exists.

In addition, a system according to the invention may include an apparatus that maintains the GRC in a low-power mode until the glare signal is provided. For example, such an apparatus may place the GRC in the low-power mode after the glare signal has not been received for a predetermined amount of time. When a glare signal is received, the GRC may be brought out of the low-power mode in order to resume its glare-reduction functions.

The invention may be embodied as a method. In one such method, glare is detected by providing a light receiving surface, receiving a first indication of the amount of light impinging on a first portion of the light receiving surface, receiving a second indication of the amount of light impinging on a second portion of the light receiving surface, determining whether the first indication or the second indication indicates glare on the light receiving surface, providing an output signal when the first indication or the second indication indicates glare on the light receiving surface, wherein the output signal does not indicate where on the light receiving surface glare exists, and reacting to the output signal by determining where on the light receiving surface glare exists.

In order to determine whether glare is indicated on the light receiving surface, the method may be carried out by determining whether the first indication is in an acceptable range. For example, it may be determined that the first indication is not in an acceptable range when the first input has a value that is greater than a threshold value.

BRIEF DESCRIPTION OF THE DRAWINGS

For a fuller understanding of the nature and objects of the invention, reference should be made to the accompanying drawings and the subsequent description. Briefly, the drawings are.

FURTHER DESCRIPTION OF THE INVENTION

Glare sources are light sources whose brightness exceeds a comfort level for the user, and generally occur at distinct locations in a scene being observed. In an embodiment of the invention, a determination is made as to whether glare is detected in the scene, and a glare indication is provided. The glare indication may indicate merely that glare has been detected, and may not indicate anything regarding the location of the glare or the intensity of the glare. If glare is detected in the scene, then a determination may be made regarding where in the scene glare was detected. Once the location of the glare is known, steps may be taken to reduce the amount of light being transmitted to the user in those areas where glare is detected. It is believed that a significant amount of power may be saved by determining whether glare is detected in a scene, and providing the glare indication only when glare is detected. As such, the invention will reduce the amount of information that must be processed.

Figure 2:
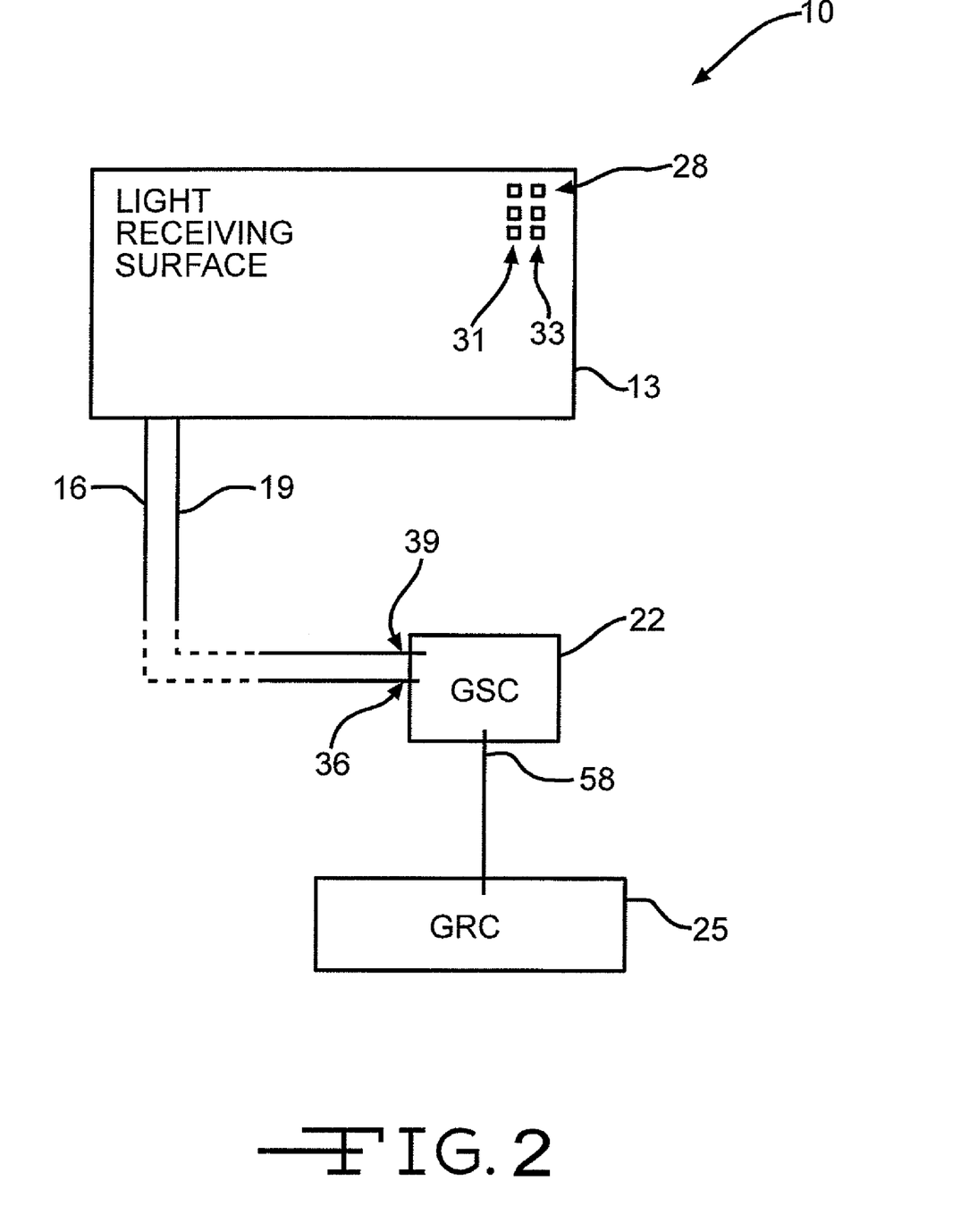
FIG. 2, which is a general schematic representation of a system according to the invention.

FIG. 2 is a schematic representation of a system according to the invention. In FIG. 2 there is shown a glare detection system 10 having a light receiving surface 13, at least two input channels 16, 19, a glare signaling circuit ("GSC") 22, and a glare reducing circuit ("GRC") 25. FIG. 2 is a schematic representation showing these components. The light receiving surface 13 may include pixels 28, six of which are schematically depicted in FIG. 2. A pixel 28 may be a device that converts light to an electric charge, such as a photodiode. A first one of the input channels 16 may provide an indication of the amount of light impinging on a first portion of the light receiving surface 13, for example one or more of the pixels 28. A second one of the input channels 19 may provide an indication of the amount of light impinging on a second portion of the light receiving surface 13, which may be one or more different pixels 28. The pixels 28 of the light receiving surface 13 may be arranged as an array of pixels 28, and the first portion may correspond to two or more pixels 28 in the array, while the second portion may correspond to a different two or more pixels 28 in the array. For example, the first portion may correspond to a first column 31 of pixels 28, while the second portion corresponds to a second column 33 of pixels.

It may often be the case that many of the pixels 28 do not detect glare. The information that might be transmitted and processed from the light receiving surface 13 can therefore be reduced by combining the information from a plurality of pixels 28 using circuitry that performs the equivalent of a logical OR function (so-called "logic-or gates"). To accomplish this task, the glare signaling circuit ("GSC") 22 may have a first input port 36 that is in communication with the first input channel 16, and the GSC 22 may have a second input port 39 that is in communication with the second input channel 19. Indeed, the GSC 22 may have an input port for every pixel 28, but we will discuss the situation with regard to two input ports 36, 39, with the understanding that many more ports may be included. A logic-or gate in the GSC 22 may be capable of producing an output signal when the logic-or gate detects that the first input channel 16 or the second input channel 19 indicates glare on the light receiving surface 13. The resultant glare signal produced by the GSC 22 at an output 58 indicates whether glare is present in one or more of the pixels 28. If no glare is present, then the GSC signal provided at output 58 will indicate that the individual pixel information need not be transmitted or processed. For example, signals from all of the pixels 28 in the sensor can be combined by the GSC 22 to determine whether glare is present anywhere in the observed scene, that is to say anywhere on the light receiving surface 13. If glare is not detected anywhere on the light receiving surface 13 (as will often be the case in a sunglasses application), then none of the individual pixel data need be transmitted for purposes of glare reduction.

Figure 3:
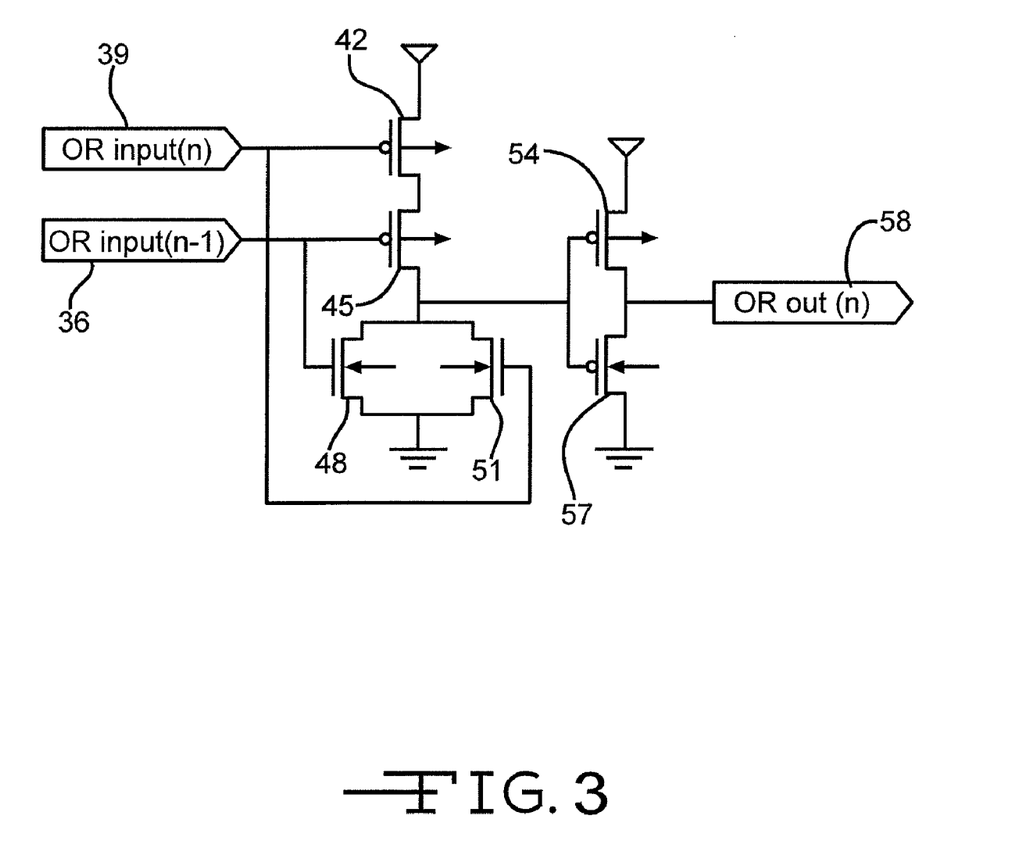
FIG. 3, which is a schematic representation of a logic-or gate that may be used in a GSC according to the invention.

FIG. 3 shows a simple logic-or gate that can be used to carry out the functions of the GSC in order to combine a signal from a pixel 28 with that of another pixel 28, or of a combination of other pixels 28. It will be noted from FIG. 3 that if either input is high, then either pFET 42 or pFET 45 (or both) is turned off, and at least one of the nFETs 48, 51 are turned on, thereby grounding the input to transistor 54 and the input to transistor 57. When either nFET 48 or nFET 51 (or both) are turned on, transistor 54 is turned on and transistor 57 is turned off, so the output is held high. This may be the situation when glare is detected.

However, if both inputs are low, then both pFET 42 and pFET 45 will be turned on, and nFET 48 and nFET 51 are turned off. In that state, the input to transistor 54 and transistor 57 is at a high level, thereby causing transistor 54 to be turned off and transistor 57 is turned on. This causes the output of the circuit depicted in FIG. 3 to be held low. This may be the situation when glare is not detected.

Two pFETs 42, 45 are shown in FIG. 3, but it should be understood that many more such pFETs may be arranged to accommodate many more pixels 28. Consequently, when all the pFETs having inputs from one or more pixels 28 are chained together in a manner similar to that shown for pFET 42 and pFET 45, the output will be low only when all the chained pFETs are turned on. With such a chain of pFETs, the data from many pixels 28 may be combined in order to reduce the amount of data that must be processed.

In another example, signals from each pixel 28 in one column 31 of pixels 28 can be combined using a logic-or gate into a single signal that indicates whether glare was detected within that column 31. If glare was not detected in a column 31, glare information from the individual pixels 28 of that column 31 need not be transmitted to the GRC 25. This can result in power savings because the pulses that would normally be sent to a pixel-increment control line of the sensor may be avoided when the logic-or gate for a column indicates no glare on that column 31 of pixels 28.

Although the arrangement described above will carry out the functions of the GSC 22, other arrangements are possible. For example, it may be possible to provide a logic-or gate (and thereby carry out the functions of the GSC) using NOR and NAND gates. One such arrangement is depicted in FIG. 4, and has an advantage over the circuit depicted in FIG. 3 in that the circuit of FIG. 4 uses fewer transistors and therefore may be smaller in size and may be less costly to manufacture.

Figure 4:
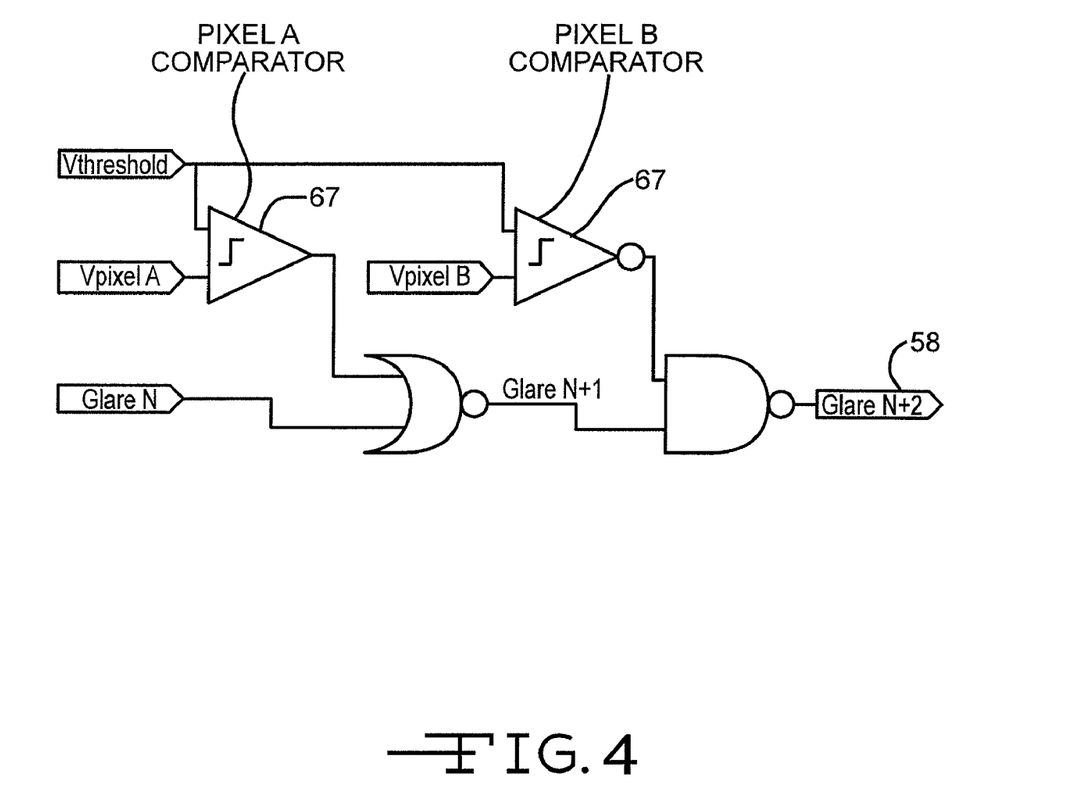
FIG. 4, which is a schematic representation of a logic-or gate that may be used in a GSC according to the invention.

In FIG. 4, the line labeled as "Glare N" is the line on which a glare signal from pixels 28 may be provided. The value of line Glare N is determined by whether glare was present on any of those pixels. In one embodiment of the invention, if glare was present, the value on Glare N is high, otherwise it is low. The circuit depicted in FIG. 4 shows a comparator with an input labeled "VpixelA". This input provides the voltage from pixel A to the comparator. The comparator of pixel A provides an output voltage which is high if glare is present on pixel A. The output from pixel A's comparator is provided as an input to a NOR gate. The output of the NOR gate will be high only if both of its inputs are low. Thus the output of the NOR gate, which is the input to the NAND gate will be high if no previous glare was observed, and low otherwise. The comparator of pixel B has an input labeled "VpixelB". This input provides the voltage from pixel B to the comparator. The output of the comparator of pixel B is an inverse output (Vbar instead of Vcomp from FIG. 6). The output of the pixel B comparator is provided to the NAND gate. The NAND gate combines the signals, and will be low only if both of its inputs are high. Both inputs are high only when no glare was present on previous pixels, including pixel A and pixel B, so the output of the NAND gate will be low if and only if there is no glare. Thus the circuit depicted in FIG. 4 is a logic-or gate, as that term is defined above. It should be noted that the circuit of FIG. 3 operates on pairs of pixels, in this instance pixel A and pixel B.

Figure 5:
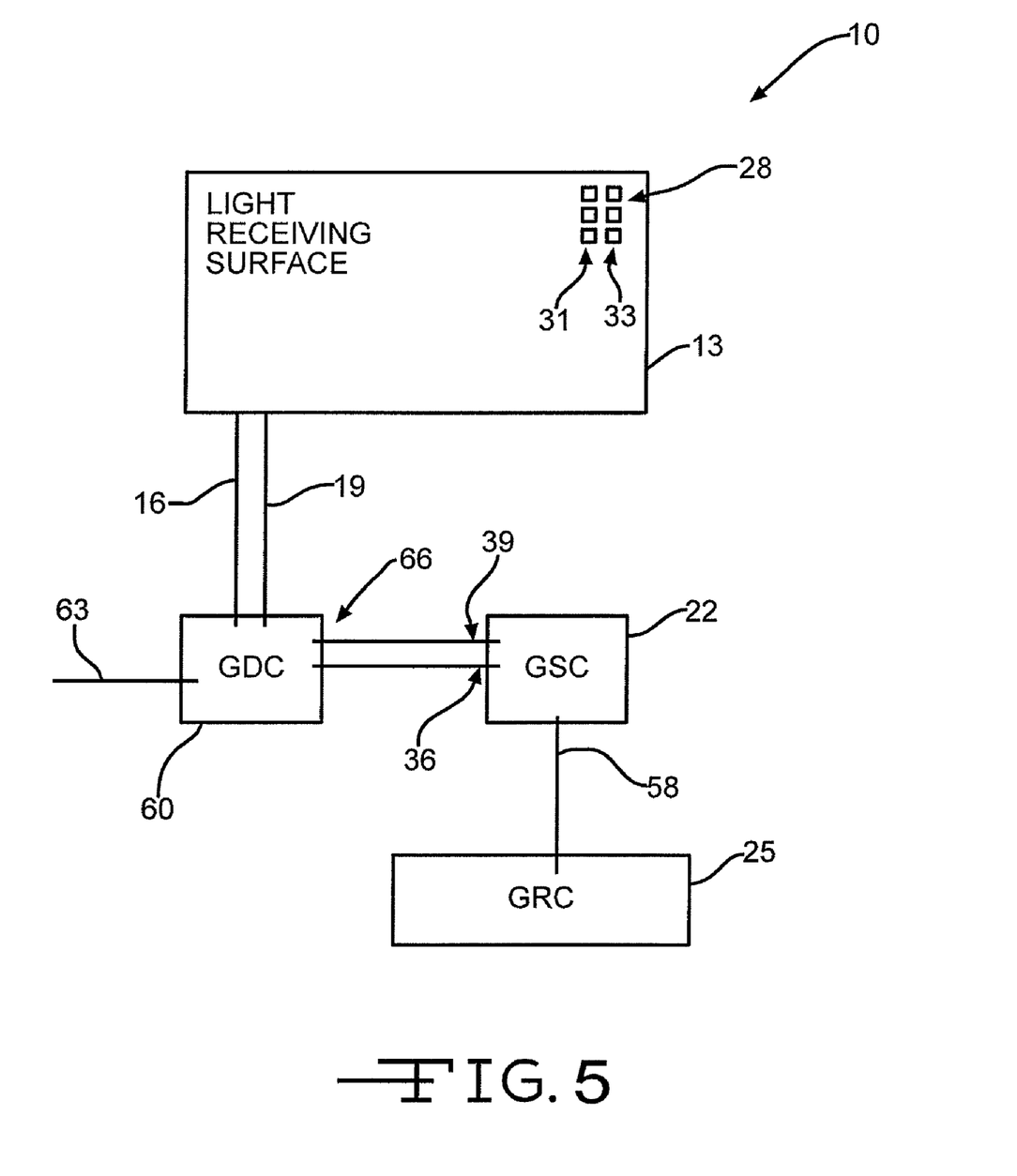
FIG. 5, which is a more detailed schematic representation of a system according to the invention.

FIG. 5 is a schematic representation similar to that shown in FIG. 2. In order to determine whether glare is present, a system according to the invention may include a glare determination circuit ("GDC") 60 having an input in communication with the first input channel 16, a threshold input 63, and an output 66 in communication with a first input port 36 of the GSC 22. The GDC 60 may also have an input in communication with the second input channel 19 and an output 66 in communication with a second input port 39 of the GSC 22. The GDC 60 may provide a glare signal via the output 66 when the indication of the first input channel 16 is not in an acceptable range relative to the threshold input 63. For example, the GDC 60 may provide the glare signal via the output 66 when the first input channel 16 indication is greater than a signal provided to the threshold input 63. The signal on the threshold input 63 may be adjusted depending on overall lighting conditions in order to properly assess whether glare is present. Further, the signal on the threshold input 63 may vary with time.

The signal generated from each pixel 28 and transmitted via the input channels 16, 19 may be converted by the GDC 60 into a digital signal. To convert the analog signal from a pixel 28 into a single bit of digital information, a comparator 67 may be used. The comparator 67 may compare two input signals and produce an output signal that indicates the relative values of the two input signals. One of the input signals may be received from the pixel 28 and the other input signal may be a threshold signal provided at the threshold input 63 by, for example, a microcontroller. In one embodiment of the invention, if the pixel signal has a value, for example a voltage, that is greater than the threshold signal, the output of the comparator 67 may be caused to be at a high voltage. This may be the case when it is desirable to indicate that glare is present on that pixel 28. But, if the pixel signal is not greater than the threshold signal, then the comparator 67 output may be caused to be at a low voltage. This may be the case when it is desirable to indicate that glare is not present on that pixel 28. In this fashion, the threshold signal may be used as a benchmark for determining when glare is present. The output of such a comparator 67 may be provided as the input to one of the pFETS 42, 45 of the GSC 22.

There are two general classes of comparators: static and dynamic. Static comparators continuously compare the input voltage levels and switch their outputs whenever their input values change their relative values. Dynamic comparators use an additional digital reset signal whose falling or rising edge determines a specific time when a voltage comparison should be made. Between edges, the dynamic comparator maintains a constant output, regardless of changes in the analog input voltages. Dynamic comparators consume less power during their steady state than static comparators because they are not continually measuring and amplifying the difference between the input signals. Although either class of comparators may be used in the invention, it is believed that by using dynamic comparators power savings may be realized not only in the comparators themselves, but also because the glare information being transferred is determined only at discrete intervals instead of continuously. Further, the use of dynamic comparators will provide a memory function of the glare situation, which should simplify the software used to control the GRC.

Figure 6:
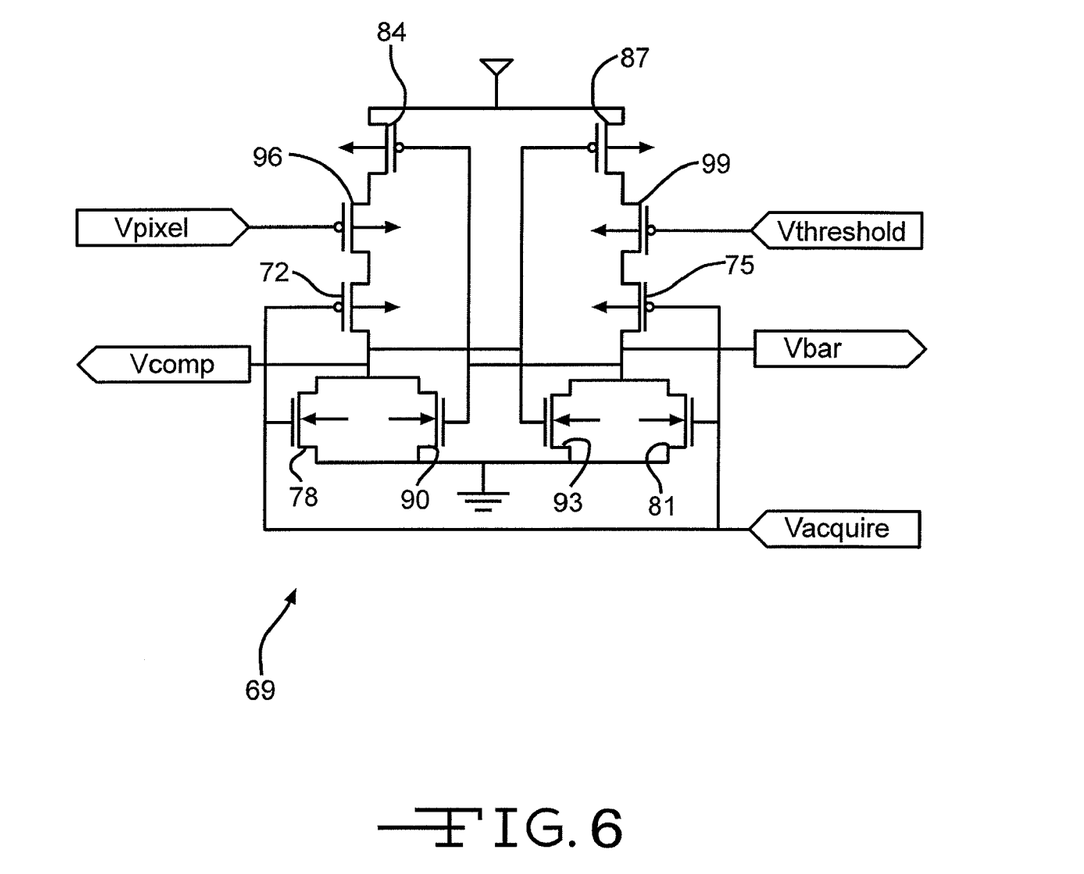
FIG. 6 which is a schematic representation of a dynamic comparator which may be used in a GDC according to the invention.

A schematic of a dynamic comparator 69 that may be used in the GDC 60 is shown in FIG. 6, which operates in the following manner. Vpixel is an analog input signal corresponding to the illumination on the pixel. Vthreshold is an analog input signal set by other circuitry, to which Vpixel will be compared. Vcomp is a digital output signal that will be high if, at the moment of comparison, Vpixel<Vthreshold, and will be low if, at the moment of comparison, Vpixel>Vthreshold. Vbar is the complementary output to Vcomp. Vacquire is a digital input signal that determines when a comparison is made and whether the output values are valid.

When Vacquire is high, pFET 72 and pFET 75 are turned off, while nFET 78 and nFET 81 are turned on. The nFETs 78, 81 connect both Vcomp and Vbar to ground, which turns the pFETs 84, 87 on and turns the nFETs 90, 93 off. In this state, a very small amount of current flows through the circuit because pFETs 72, 75 are off. When Vacquire transitions to low, pFETs 72, 75 are turned on while nFETs 78, 81 are turned off. Vcomp and Vbar can now be charged up to a positive value by currents running through transistors 84, 87, 96, 99, 72 and 75. Which output (Vcomp, Vbar) charges up faster will depend on the relative values of Vpixel and Vthreshold. Whichever input is lower will turn its transistor on harder, which will therefore allow more current to pass. If Vpixel is lower than Vthreshold, then Vcomp will charge up faster than Vbar. As Vcomp gets higher, it will reinforce the imbalance by turning pFET 87 off and nFET 93 on. Turning off pFET 87 will slow the charging of Vbar, and turning on nFET 93 will drain Vbar and pull it back down to ground. Once Vcomp has charged up to the power supply voltage, pFET 87 will be completely turned off and nFET 93 will be completely turned on, which will in turn lock the outputs into permanent states which will persist as long as Vacquire stays low, regardless of the relative values of Vpixel and Vthreshold. If Vpixel had been higher than Vthreshold at the time of comparison, then the end result would be Vcomp in a low state and Vbar in a high state. Current flows through the circuit during the comparison, but once a final state is established, current is blocked by either one of transistors 84, 87 or by one of transistors 90, 93 being turned off in each chain. Either Vbar or Vcomp can be used in downstream circuitry, depending on the downstream logic and whether the pixel's signal becomes more positive or becomes more negative with higher light intensity.

When comparing a pixel signal on the first or second input channel 16, 19 to a threshold value in order to determine whether glare exists, the threshold value provided at input 63 need not be the same for all pixels 28. For example, it may be desirable to have a higher threshold value for pixels 28 in a center portion of the light receiving surface 13 than for pixels 28 near the edge of the light receiving surface 13. In this manner, light from a centrally located source will strike centrally located pixels 28 at an angle that is nearer to normal incidence than light from that same source striking pixels 28 located at the edges, and yet by using differing threshold values, the response of the system 10 may be more uniform with respect to each pixel 28.

Information from the GSC 22 may be sent to the GRC 25 when glare is detected on the light receiving surface 13. For example, the GRC 25 may be in communication with the logic-or gate of the GSC 22. The GRC 25 may include a microcontroller running a control program, which enables the GRC 22 to react when the logic-or gate of the GSC 22 produces the output signal indicating that glare has been detected. For example, the GRC 25 may react by determining where on the light receiving surface 13 glare exists. Doing so may entail determining which of the signals from the pixels 28 has exceeded the threshold value being used to detect glare. Once the GRC 25 determines where glare exists, the GRC 25 may cause corresponding light valves to reduce the amount of light being transmitted. The corresponding light valves may be those that correspond to pixels 28 for which glare was detected.

When the GRC 25 is a microcontroller, the GRC 25 may consume a significant amount of power. A system according to the invention may be configured to include an apparatus, such as controlling software that may be included on the GRC 25, to keep the GRC 25 in a low-power mode until glare is detected. When glare has not been detected for a significant amount of time, the GRC 25 may switch some control functions to a low-power oscillator circuit. For example, timing signals that are sent by the microcontroller 25 to indicate when the light receiving surface 13 should be evaluated for glare may instead be sent by a low-power oscillator circuit, thereby allowing the relatively high-power microcontroller 25 to place itself in a mode where minimal power is used. The low-power oscillator circuit may then periodically request an update as to whether glare has been detected on the light receiving surface 13. In response to one such request, the response may be a glare signal indicating glare has been detected on the light receiving surface 13, and in that situation the glare signal may be transmitted to a pin on the GRC 25 designated for bringing the GRC 25 out of the low-power mode. When the glare signal is received at such a pin, the GRC 25 would be brought from the low-power mode to an analysis-mode in which the GRC 25 would then reassume control of the control lines of the sensor to determine where on the light receiving surface 13 the glare source was detected. The microcontroller 25 may thereafter operate in its normal glare-reduction mode to react to glare on the light receiving surface 13 until the next significant pause in glare sources appears. If no glare sources are detected for a predetermined amount of time, the GRC 25 may be placed again in the low-power mode.

In another embodiment of the invention, further power savings may be realized by creating the timing signals, which indicate when the light receiving surface 13 should be evaluated for glare, less frequently when glare has not been detected for a predetermined amount of time. When glare is detected, the timing signals may be created more frequently so that the GDC 60 may react to changing glare situations. For example, when glare has been detected, requests for glare information from the pixels 28 can be sent many times each second and the information may be used to make adjustments designed to reduce the effect of the glare. When glare has not been detected for a significant period of time, the system would send requests for glare information less frequently.

Figure 7:
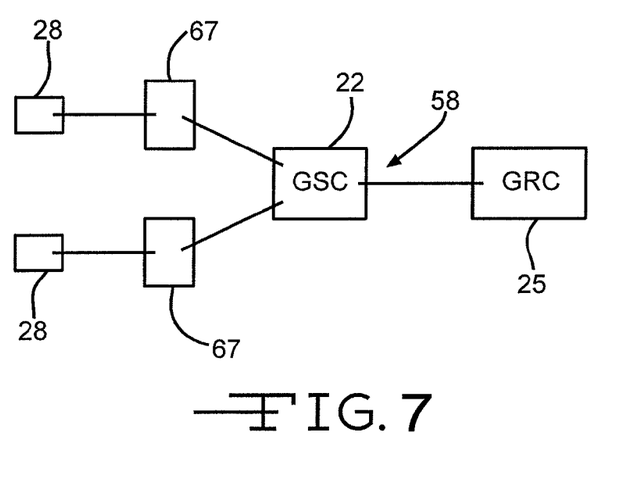
FIG. 7, which is a schematic representation of a system according to the invention.

It should be noted that FIGS. 2 and 5 are schematic representations of systems according to the invention. It may be the case that the functions of the GDC 60 will be accomplished by devices that are distributed about a sensor. FIG. 7 is a schematic of such a system. For example, a pixel 28 may be in communication with a comparator 67 that is designed to detect glare on that pixel 67 and therefore carry out the functions of the GDC 60 with respect to that pixel 28. That comparator 67 may be proximately located to the pixel 28 and be in communication with the GSC 22, which accepts the output from that comparator 67, as well as the outputs from other comparators 67 that are associated with other pixels 28. The GSC 22 then determines whether any of the comparators 67 are indicating glare, and if glare is indicated, then the GSC 22 sends the glare indication to the GRC 25 via the output 58. The glare indication need not indicate where glare was detected, and if so, the glare indication provided via output 58 may be thought of as indicating merely that glare was detected.

Similarly, the functions of the GSC 22 may be distributed about a sensor. For example, a logic-or gate may be located proximate to each pixel or column of pixels in order to determine whether that pixel, or any of the pixels in that column, indicate glare. The outputs from similarly situated logic-or gates may be combined, and the combined output signal may be sent to the GRC 25.

Figure 8:
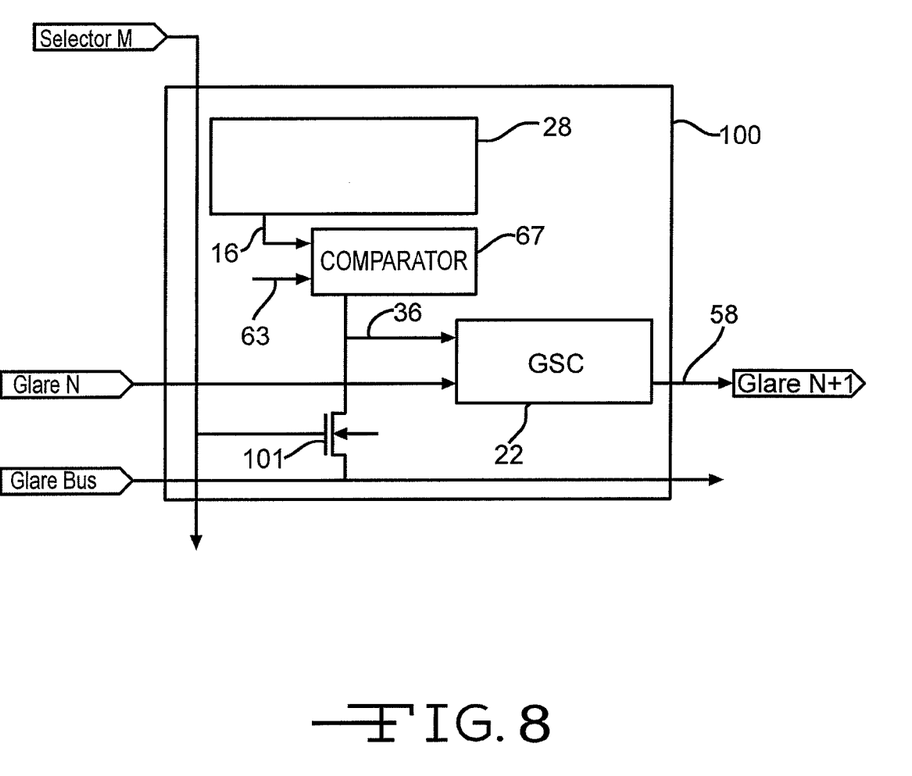
FIG. 8, which is a schematic representation of a processing unit according to the invention.

To illustrate a system that distributes the functions of the GDC 60 and the GSC 22 to the pixel level, consider the schematic of FIG. 8. FIG. 8 is a schematic representation of a processing unit 100 that may be used in a system according to the invention. In such a processing unit 100, there may be a pixel 28 that is in communication with a comparator 67. The comparator 67 carries out the functions of the GDC 60 by determining whether glare is on the pixel 28 by comparing a signal from the pixel 28 to a threshold signal provided at the input 63. The comparator 67 sends a signal to the GSC 22, which combines the signal from comparator 67 with a signal on the line labeled "Glare N". The line Glare N indicates whether glare has been detected on other pixels that are part of other processing units, which are not shown in FIG. 8. If the inputs to the GSC 22 shown in FIG. 8 indicate glare, then the GSC 22 provides an indication of glare on its output line, which is labeled "Glare N+1". The processing unit 100 shown in FIG. 8 may be used for each pixel on the light receiving surface 13. If the comparator 67 and GSC 22 shown in FIG. 8 are located proximate to the pixel 28, the functions of the GDC 60 and the GSC 22 are distributed about the light receiving surface 13. Such an arrangement is within the scope of the system depicted schematically in FIG. 5.

Also shown in FIG. 8 is a line labeled "Selector M" and a line labeled "Glare Bus". When the GSC output 58 indicates that glare has been detected on the light receiving surface 13, the GRC 25 may react by trying to determine where on the light receiving surface 13 glare exists. In order to do so, the GRC 25 may send a signal on line Selector M, which will cause transistor 101 to allow information from the pixel 28 to be sent to the GRC 25 along the line Glare Bus. In this manner, the GRC 25 will be able to determine whether the pixel 28 has glare. This information may be used by the GRC 25 to further react to the glare by (for example) causing light valves to be constricted. In this fashion, once glare has been detected, glare information may be sent to the GRC 25 from those pixels 28 where glare was detected.

Figure 10:
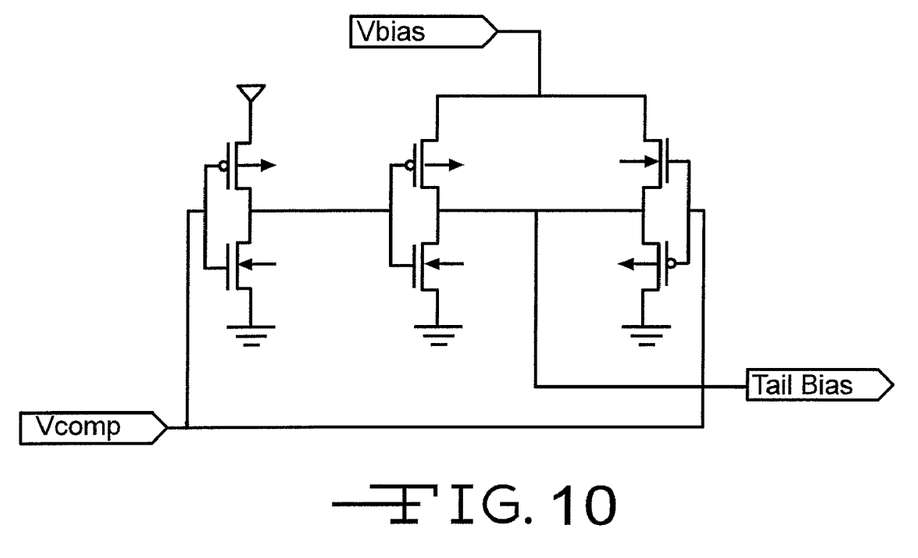
FIGS. 10 and 11, which are schematic representations of circuits that may be used to provide information to the GRC from pixels corresponding to glare.
Figure 11:
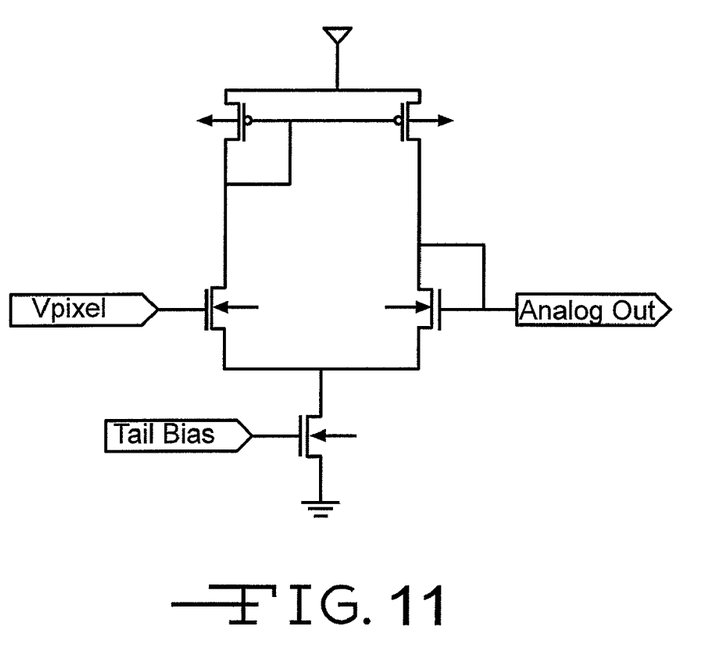

To avoid power consumption by analog output circuitry associated with a pixel 28, the digital output of the comparator 67 may be used to control the power to a transistor or amplifier that sends the analog pixel voltage to the GRC 25 when glare is detected. Thus the circuitry needed to send information to the GRC 25 may be turned off when glare is not detected at a pixel 28, and turned on when glare is detected by the pixel 28. In this manner, if glare is not detected on a pixel (or group of pixels), then information from the pixel (or group of pixels) is not transmitted beyond the GDC 60. In this manner, power savings may be realized. FIGS. 10 and 11 are schematics showing circuits that accomplish this goal. In FIG. 10 there is shown a circuit that supplies the analog voltage ("Vbias") from a pixel 28 to the line labeled "Tail Bias" if the output line labeled Vcomp from the GDC 60 comparator 67 is high. When line Vcomp from the GDC 60 comparator 67 is low, then line Tail Bias is connected to ground. In effect, the circuit of FIG. 10 controls the Tail Bias line according to whether there is glare on the pixel.

In FIG. 11, there is shown a circuit in which the line Tail Bias controls power consumption of circuitry associated with a pixel 28. If line Tail Bias is kept at ground, no power is consumed by the circuitry performing functions to provide the GRC 25 with information about the level of glare on the pixel 28, and no information from the pixel 28 is transmitted, except for that which is sent to the GSC 22. When line Tail Bias is at ground, no information is transmitted on the line labeled "Analog Out". However, if line Tail Bias is set to Vbias, the analog voltage at line Vreceptor is transmitted to line Analog Out, which is in communication with the processing circuits GRC 25. The circuit of FIG. 11 may be thought of as an analog buffer circuit that can be turned on by the Tail Bias line. In this manner, the measured analog signal from each pixel 28 can be compared to the appropriate threshold level for that pixel's 28 particular position to determine whether a glare source is present.

Figure 9:
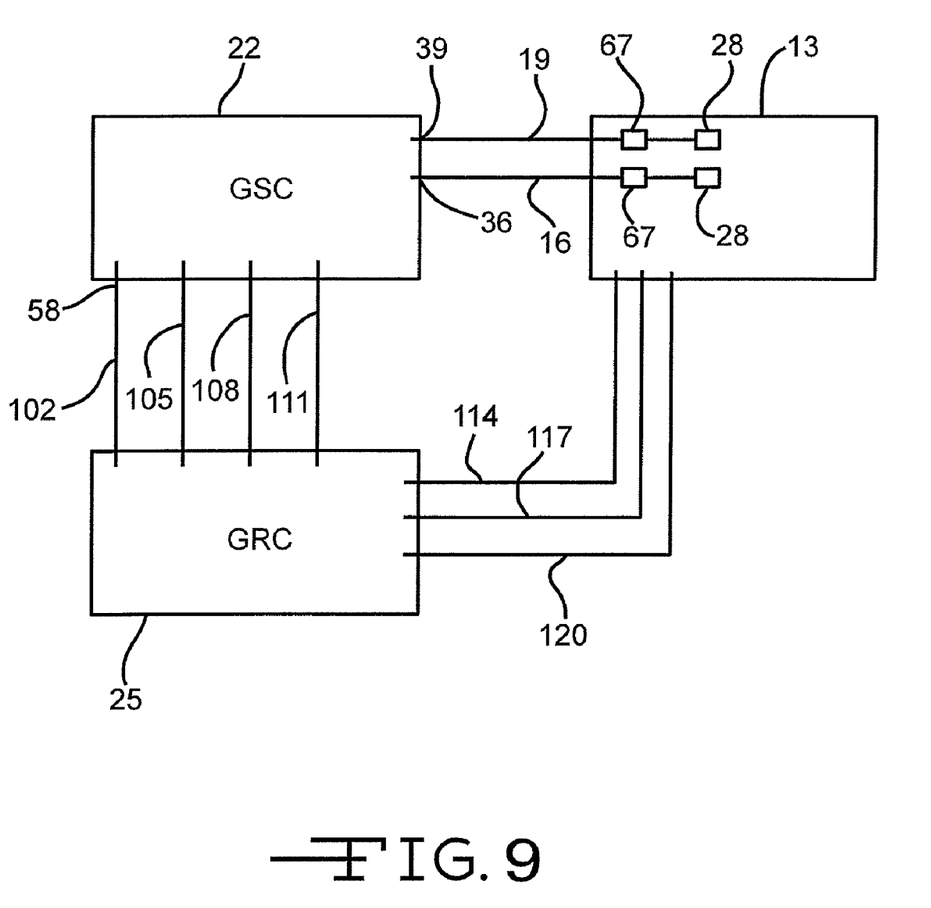
FIG. 9, which is a schematic representation of a system according to the invention.

FIG. 9 is a schematic showing how the GRC 25 might be in communication so as to function as described above. The GRC 25 may have a plurality of communication lines 102-111, which may be used to communicate information to the GRC 25. For example, the output signal from the GSC 22, which indicates when glare has been detected on one of the pixels 28, may be transmitted to the GRC 25 on communication line 102. On communication line 105, the GSC 22 may provide the GRC 25 with information regarding whether a column in the array of pixels 28 has one or more pixels 28 indicating glare. Communication line 108 may be used to provide information regarding whether an individual pixel 28 is indicating glare. Communication line 111 may be used to provide information regarding the voltage level of an individual pixel 28.

The GRC 25 may communicate instructions via a plurality of control lines 114-120. Control line 114 may be used to cause acquisition of a glare image. Control line 117 may be used to increment a pixel address, and control line 120 may be used to increment a column address. By incrementing the pixel address, glare information for the next sequentially ordered pixel 28 would be caused to be transmitted to the GSC 22. If the GSC 22 indicates that a column of pixels 28 is not indicating glare, the column address may be incremented so that glare information for that column of pixels 28 is not transmitted. In this fashion, information for a column of pixels may be skipped by transmitting a single pulse on the control line 120 instead of sending many pulses on the control line 117. Thus a system according to the invention could skip transmitting glare information for columns that did not detect glare, thereby saving power.

It should be noted that the communication lines 102-111 and the control lines 114-120 are intended to illustrate the flow of information. A system according to the invention need not have a dedicated conductor corresponding to each communication line 102-111, nor must a system according to the invention have a dedicated conductor corresponding to each control line 114-120. For example, all three types of information described above as being transmitted on control lines 114-120 may be sent over a single conductor. Different pulse sequences or pulse lengths on a single conductor could be used to communicate instructions to and from the GRC 25.

Figure 12:
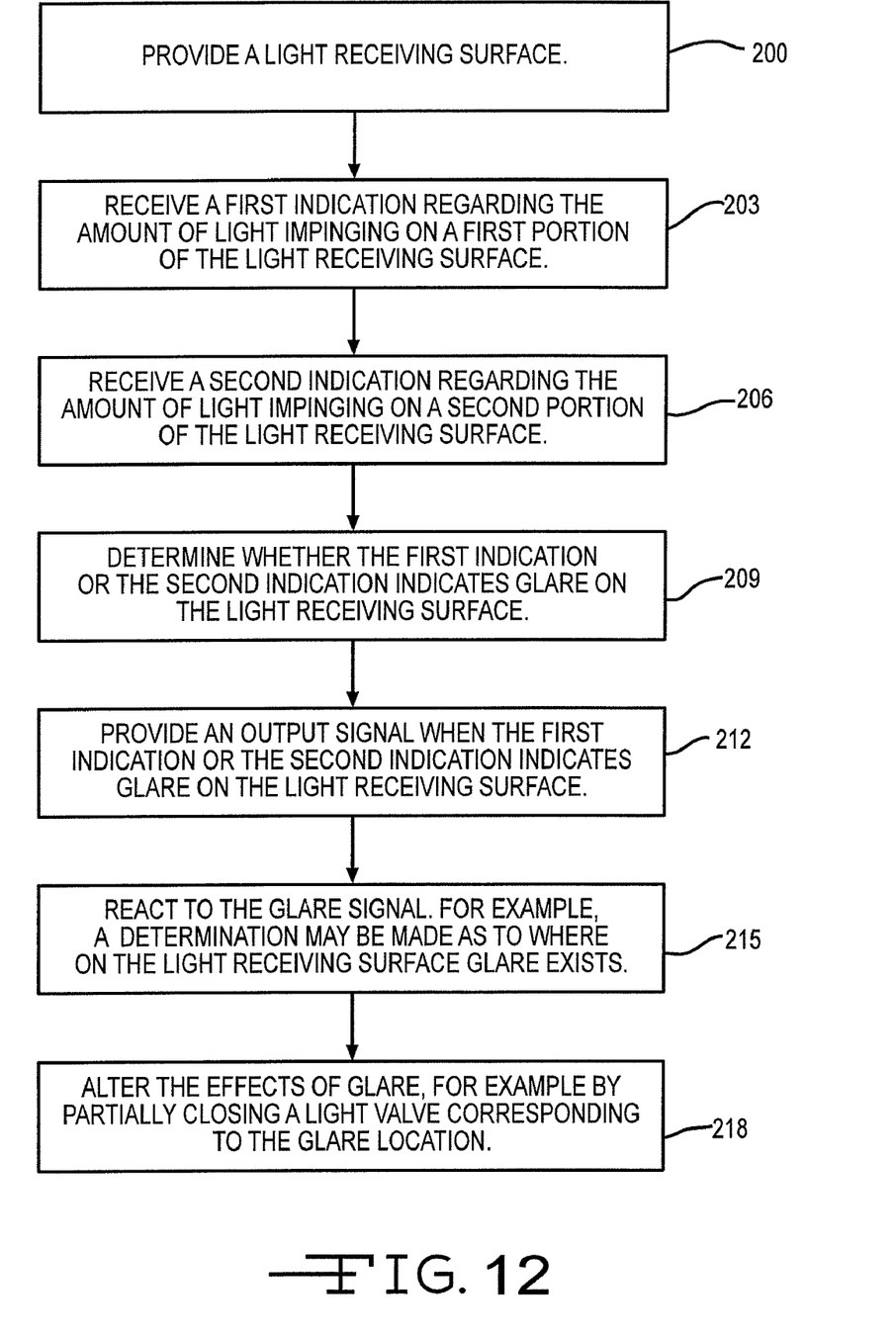
FIG. 12, which is a flow chart depicting a method according to the invention.

The invention may be embodied as a method of detecting glare. FIG. 12 illustrates one such method. A light receiving surface may be provided 200, and a first indication may be received 203, the first indication may be the amount of light impinging on a first portion of the light receiving surface. A second indication may be received 206, the second indication being the amount of light impinging on a second portion of the light receiving surface. Then a determination may be made 209 as to whether the first indication or the second indication indicates glare on the light receiving surface. An output signal may be provided 212 when the first indication or the second indication (or both) indicates glare on the light receiving surface. Note that the output signal does not indicate where on the light receiving surface glare exists—only that glare does exist. When the output signal indicates glare exists, a reaction may be made 215 in which a determination is made as to where on the light receiving surface glare exists. Once the location of the glare is determined, actions may be taken 218 to alter the effects of the glare, for example by partially closing a light valve corresponding to the glare location.

In determining whether glare is indicated on the light receiving surface, a determination may be made as to whether the first indication is in an acceptable range. For example, it may be determined that the first indication is not in an acceptable range when the value of the first input is greater than a threshold value. The first indication may be received in the form of an analog or digital electric signal.

The light receiving surface may include pixels, and the first portion may correspond to one of the pixels. Further, the second portion may correspond to a different one of the pixels. Also, the light receiving surface may have pixels arranged in an array, and the first portion may correspond to part of the array, for example a first column. Similarly, the second portion may correspond to a different part of the array, for example a second column.

In this manner, power consumption by the processing circuits may be reduced by transmitting a minimum amount of information to them. Power savings may be realized from both the reduction in information transmitted, as well as the reduction in the processing that the processing circuits might do on that information.

It will now be recognized that the invention may be practiced by deriving a single bit of information from a group of pixels, and thereby reduce the amount of information required to be transmitted from the light receiving surface to the processing circuits (GRC 25). Furthermore, by combining information from groups of pixels, the invention may reduce the amount of information transferred for scenes with a limited number of glare sources. Reducing information saves power both during transfer and during processing. Furthermore, the invention may be embodied to utilize the GDC comparator's output to turn on an analog output from a processing unit associated with a pixel, thereby saving power while still providing detailed information about those portions where glare is detected.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. A glare detection system, comprising:
   a light receiving surface;
   a first input channel providing an indication of the amount of light impinging on a first portion of the light receiving surface;
   a second input channel providing an indication of the amount of light impinging on a second portion of the light receiving surface;
   a glare signaling circuit ("GSC") having:
   (a) a first input port in communication with the first input channel,
   (b) a second input port in communication with the second input channel,
   (c) a logic-or gate capable of producing an output signal when the logic-or gate detects that the first input channel or the second input channel indicates glare on the light receiving surface; and
   a glare reducing circuit ("GRC") in communication with the logic-or gate, the GRC being capable of reacting when the logic-or gate produces the output signal.

2. The glare detection system of claim 1, further comprising a glare determination circuit ("GDC") having:
   (a) an input in communication with the first input channel,
   (b) a threshold input, and
   (c) an output in communication with the GSC first input port, wherein the GDC provides a glare signal via the GDC output when the first input channel indication is not in an acceptable range relative to the threshold input.

3. The glare detection system of claim 2, wherein the GDC provides the glare signal when the first input channel indication is above the threshold input.

4. The glare detection system of claim 2, wherein the GDC accepts an analog signal at the GDC input and the glare signal is a digital signal.

5. The glare detection system of claim 2, further comprising circuitry for transmitting the glare signal to a switch which controls the provision of information from the first input channel to the GRC when the glare signal is received by the switch.

6. The glare detection system of claim 2, wherein a signal on the threshold input may vary with time.

7. The glare detection system of claim 2 wherein the first portion is comprised of at least two pixels, and if the logic-or gate does not detect glare on any of the pixels of the first portion, then information from the pixels is not transmitted beyond the GDC.

8. The glare detection system of claim 1, wherein the GRC reacts by determining where on the light receiving surface glare exists.

9. The glare detection system of claim 1, further comprising an apparatus that maintains the GRC in a low-power mode until the glare signal is provided.

10. The glare detection system of claim 9, wherein the apparatus places the GRC in the low-power mode after the glare signal has not been received for a predetermined amount of time.

11. The glare detection system of claim 1, wherein the light receiving surface includes pixels, and the first portion corresponds to one of the pixels.

12. The glare detection system of claim 1, wherein the light receiving surface includes an array of pixels, and the first portion corresponds to at least two pixels.

13. The glare detection system of claim 12, wherein the at least two pixels are arranged as a column of pixels.

14. A method of detecting glare, comprising:
   providing a light receiving surface;
   receiving a first indication of the amount of light impinging on a first portion of the light receiving surface;
   receiving a second indication of the amount of light impinging on a second portion of the light receiving surface;
   determining whether the first indication or the second indication indicates glare on the light receiving surface;
   providing an output signal when the first indication or the second indication indicates glare on the light receiving surface, wherein the output signal does not indicate where on the light receiving surface glare exists; and
   reacting to the output signal by determining where on the light receiving surface glare exists.

15. The method of claim 14, wherein determining whether glare is indicated on the light receiving surface, includes determining whether the first indication is in an acceptable range.

16. The method of claim 15, wherein the first indication is not in an acceptable range when the first input is greater than a threshold value.

17. The method of claim 16, wherein the threshold value may vary with time.

18. The method of claim 14, wherein the first indication is received in the form of an analog signal.

19. The method of claim 14, wherein the output signal is provided as a digital signal.

20. The method of claim 14, wherein the light receiving surface includes pixels, and the first portion corresponds to one of the pixels.

21. The method of claim 14, wherein the light receiving surface includes an array of pixels, and the first portion corresponds to at least two pixels in the array.

22. The method of claim 21, wherein the part of the may is a column of pixels.

23. The method of claim 21, wherein if glare is detected in the column, then information from pixels in the column is used to determine where on the light receiving surface glare exists.

24. A glare detection system, comprising:
   a first light sensor having an output channel;
   a second light sensor having an output channel;
   a glare signaling circuit (GSC) having a first input in communication with the output channel of the first light sensor, and having a second input in communication with the output channel of the second light sensor, the GSC having a logic-or gate capable of providing an indication of glare when glare is detected on the first light sensor or the second light sensor.

25. The glare detection system of claim 24, further comprising a glare determination circuit ("GDC") having:
   (a) an input in communication with the first light sensor output channel,
   (b) a threshold input, and
   (c) an output in communication with the GSC first input, wherein the GDC provides a glare signal via the GDC output when the output channel of the first light sensor is not in an acceptable range relative to the threshold input.

26. The glare detection system of claim 25, wherein the GDC provides the glare signal when the first input channel indication is greater than a signal on the threshold input.

27. The glare detection system of claim 26, wherein the signal on the threshold input may vary with time.

28. The glare detection system of claim 25, wherein the GDC accepts an analog signal at the GDC input and the glare signal is a digital signal.

29. The glare detection system of claim 24, wherein the first light sensor includes at least two pixels.

30. The glare detection system of claim 29, wherein the at least two pixels are arranged as a column of pixels.

31. The glare detection system of claim 29 wherein if glare is indicated on the first light sensor, then information from the two pixels is used to determine where on the first light sensor glare exists.

\* \* \* \* \*